United States Patent [19]
Lee et al.

[11] Patent Number: 5,635,747
[45] Date of Patent: Jun. 3, 1997

[54] NONVOLATILE SEMICONDUCTOR MEMORIES WITH A CELL STRUCTURE SUITABLE FOR A HIGH SPEED OPERATION AND A LOW POWER SUPPLY VOLTAGE

[75] Inventors: Hyong-Gon Lee; Sang-Ki Hwang; Cheol-Ung Jang, all of Suwon; Young-Wi Ko, Seoul; Sung-Hee Cho, Suwon, all of Rep. of Korea

[73] Assignee: Samsung Electronics Co., Ltd., Suwon, Rep. of Korea

[21] Appl. No.: 481,098

[22] Filed: Jun. 7, 1995

Related U.S. Application Data

[62] Division of Ser. No. 220,593, Mar. 31, 1994, abandoned.

[30] Foreign Application Priority Data

Mar. 31, 1993 [KR] Rep. of Korea ............... 5329/1993

[51] Int. Cl.$^6$ .................. H01L 29/76; H01L 29/94; H01L 29/788
[52] U.S. Cl. ............................ 257/386; 257/316
[58] Field of Search ............................ 257/314, 315, 257/316, 317, 318, 319, 320, 321, 356, 357, 386; 365/185.16, 185.26, 185.28, 185.33

[56] References Cited

U.S. PATENT DOCUMENTS

| | | | |
|---|---|---|---|
| 4,962,481 | 10/1990 | Choi et al. | 365/185 |
| 4,999,812 | 3/1991 | Amin | 365/185 |
| 5,103,425 | 4/1992 | Kuo et al. | 365/185 |
| 5,235,200 | 8/1993 | Komori et al. | 257/315 |
| 5,247,480 | 9/1993 | Itoh et al. | 365/185 X |
| 5,267,196 | 11/1993 | Talreja et al. | 365/185 |
| 5,280,451 | 1/1994 | Akaogi | 365/200 |
| 5,323,039 | 6/1994 | Asano et al. | 257/315 |
| 5,369,608 | 11/1994 | Lim . | |
| 5,416,351 | 5/1995 | Ito et al. | 257/357 |

FOREIGN PATENT DOCUMENTS

| | | | |
|---|---|---|---|
| 55-156371 | 12/1980 | Japan | 257/326 |
| 9220209 | 10/1992 | Rep. of Korea . | |

*Primary Examiner*—Ngân V. Ngô
*Attorney, Agent, or Firm*—Cushman Darby & Cushman, IP Group of Pillsbury Madison & Sutro LLP

[57] ABSTRACT

A nonvolatile semiconductor memory with a unit cell structure suitable for high speed operation and a low power supply voltage. The nonvolatile semiconductor memory includes a switching circuit including block select transistors connected by its respective terminal to a corresponding bit line. This switching circuit transmits a signal only when a string to which the switching circuit corresponds is selected. A second active region having a different impurity concentration from a first active region constituting source and drain regions of memory transistors is formed at a substrate contact portion of a bit line contact portion where the memory string and bit line are connected. The impurity concentration of the second active region is lower than that of the first active region.

2 Claims, 5 Drawing Sheets

NONVOLATILE SEMICONDUCTOR MEMORIES WITH A CELL STRUCTURE SUITABLE FOR A HIGH SPEED OPERATION AND A LOW POWER SUPPLY VOLTAGE

This application is a division of application Ser. No. 08/220,593, filed Mar. 31, 1994, now abandoned.

BACKGROUND OF THE INVENTION

The present invention relates to nonvolatile semiconductor memories with a NAND logic memory cell structure, and more particularly to highly integrated nonvolatile semiconductor memories having a unit memory cell structure suitable for high speed operation and a low power supply voltage.

A nonvolatile semiconductor memory such as an EEPROM (Electrically Erasable and Programmable Read Only Memory) or MROM (Mask Read Only Memory) usually has a NAND logic memory cell structure in order to reduce power consumption and improve integration density. NAND unit memory cells are arranged in memory strings, and there are a plurality of NAND unit memory cells formed in a matrix of rows and columns on a chip. As the integration density of a memory device is increased, the spacing between memory strings necessarily becomes narrower, and requires design-rules that are much more difficult to practically implement. Further, the spacing between bit lines also decreases and the line width of each bit line also narrows. These phenomena may create coupling capacitance between bit lines and increase bit line resistance, thus reducing the efficiency of signal transmission through the bit line. Therefore, it is difficult to fabricate a highly integrated nonvolatile semiconductor memory device having a high operation speed and improved operating characteristics using a low power supply voltage.

FIG. 1 shows memory access transistors of typical unit memory cells having a NAND logic structure. Two memory strings are connected to one bit line BL and each memory string consists of two string select transistors controlled by signals on string select lines SSL1, SSL2 and memory transistors controlled by signals on word lines WL1-WLn. Two string select transistors, enhancement mode transistor 2 and depletion mode transistor 12, are each connected to a bit line contact portion 10 and connected serially to respective memory strings such that string select signals SSL1, SSL2 select one of the memory strings. All memory transistors 6, 16, 8, 18 are enhancement mode transistors. During a data reading operation, if memory transistor 6 of string #1 is selected, a read data signal is applied to the bit line BL. Supply voltage VCC and ground voltage 0V are respectively applied to first and second string select signals SSL1 and SSL2. The ground voltage 0V is applied to word line WL1 and the supply voltage VCC is applied to all other word lines WL2, . . . , WLn, thereby reading out the data stored in the memory transistor 6.

If there are 8 memory transistors within one unit string and the semiconductor memory is 16 Mbits (mega=$2^{20}$) in size, the architecture of a cell array may have a layout such as 1K×16K (K=$2^{10}$), 2K×8K or 4K×4K. If a 2K×8K layout is chosen, 1K unit strings are serially connected to one bit line. Loading on each bit line within the chip is greatly increased, resulting in a delay of the signal transmission or in a malfunction at a low power supply voltage. Moreover, capacitances are generated, for example, between the substrate and the metal bit line, between the polysilicon layer forming a word line and the metal line formed on the polysilicon layer, and between metal lines. There are also drain overlap capacitances of the enhancement made memory transistors nearest to the bit line. In order to achieve a more highly integrated nonvolatile semiconductor circuit of 64 Mbits, 256 Mbits or more in which the degree of memory cell integration is increased and the power supply voltage is lowered, these problems must be overcome.

Increased bit line loading also creates junction capacitance at the bit line contact portion 10. FIG. 2 shows a cross sectional view of the bit line contact portion 10 of FIG. 1. Bit line 22 formed of metal is in contact with $N^+$ active region 24. $N^+$ active regions 26 are used as a drain and a source of a transistor, and gate electrodes 32A to 32D of transistors which are formed with polysilicon are used as connecting means within the chip. In the construction of FIG. 2, the $N^+$ active region 24 is formed at the bit line contact portion in addition to the $N^+$ active regions 26 used as the drain and source regions of a transistor, in order to enhance mobility of a carrier. The junction capacitance of the $N^+$ active region 24 is based on its impurity concentration. This junction capacitance exists at a large number of bit line contact portions within the chip, resulting in the delay of the signal transmission. If gate electrode 32C is a control terminal of a depletion mode transistor and gate electrode 32D is a control terminal of an enhancement mode transistor, overlap capacitance is generated during a stand-by operation or a data access operation, since a ground voltage is applied as the control voltage of the enhancement mode transistor as indicated by a dashed-line circle 36. Consequently, in a very large scale semiconductor memory of 64 Mbits or more, high speed operation is hindered and malfunctions occur at a low power supply voltage during a reading operation.

SUMMARY OF THE INVENTION

It is therefore an object of the present invention to provide a nonvolatile semiconductor memory having a memory cell structure which has improved adaptive capability at a low power supply voltage.

It is another object of the present invention to provide a nonvolatile semiconductor memory capable of performing a high speed reading operation.

It is yet another object of the present invention to provide a nonvolatile semiconductor memory having a memory cell structure which minimizes bit line loading and associated capacitance problems.

It is still another object of the present invention to provide a nonvolatile semiconductor memory for performing a high speed data access operation and improving an operating characteristic at a low power supply voltage.

It is still yet another object of the present invention to provide a nonvolatile semiconductor memory having a memory cell structure for suppressing junction capacitance generated between a memory cell and a bit line contact.

It is a further object of the present invention to provide a nonvolatile semiconductor memory having a cell structure for reducing overlap capacitance of the enhancement mode transistor nearest to a memory cell connection to a bit line.

In accordance with the present invention, a nonvolatile semiconductor memory includes a semiconductor substrate having a first conductivity type, a well region formed at the surface of the semiconductor substrate, a plurality of memory strings formed at the well region, and a plurality of bit lines formed in parallel on the semiconductor substrate. Preferably, each memory string includes switching means connected to a corresponding one of the bit lines. The switching means transmits a signal only when a string to which the switching means belongs is selected.

First and second active regions are used as a source and a drain region of a transistor and are formed where the memory string and bit line are connected. The ion implantation concentration of the second active region is lower than that of the first active region.

BRIEF DESCRIPTION OF THE DRAWINGS

The above objects and other advantages of the present invention will be explained by the following detailed description of presently preferred embodiments taken in conjunction with the attached drawings, in which.

DETAILED DESCRIPTION OF THE PRESENTLY PREFERRED EMBODIMENTS

As used herein, a "string select transistor" is ideally embodied by an enhancement mode transistor or a depletion mode transistor, and enables or disables a string containing a specific memory transistor for storing data. The string select transistor is enabled by string select control signals. The term "block select transistor" indicates switching means included in each memory string and disposed between a string select transistor and a bit line contact portion to suppress the bit line capacitance.

Figure 3:
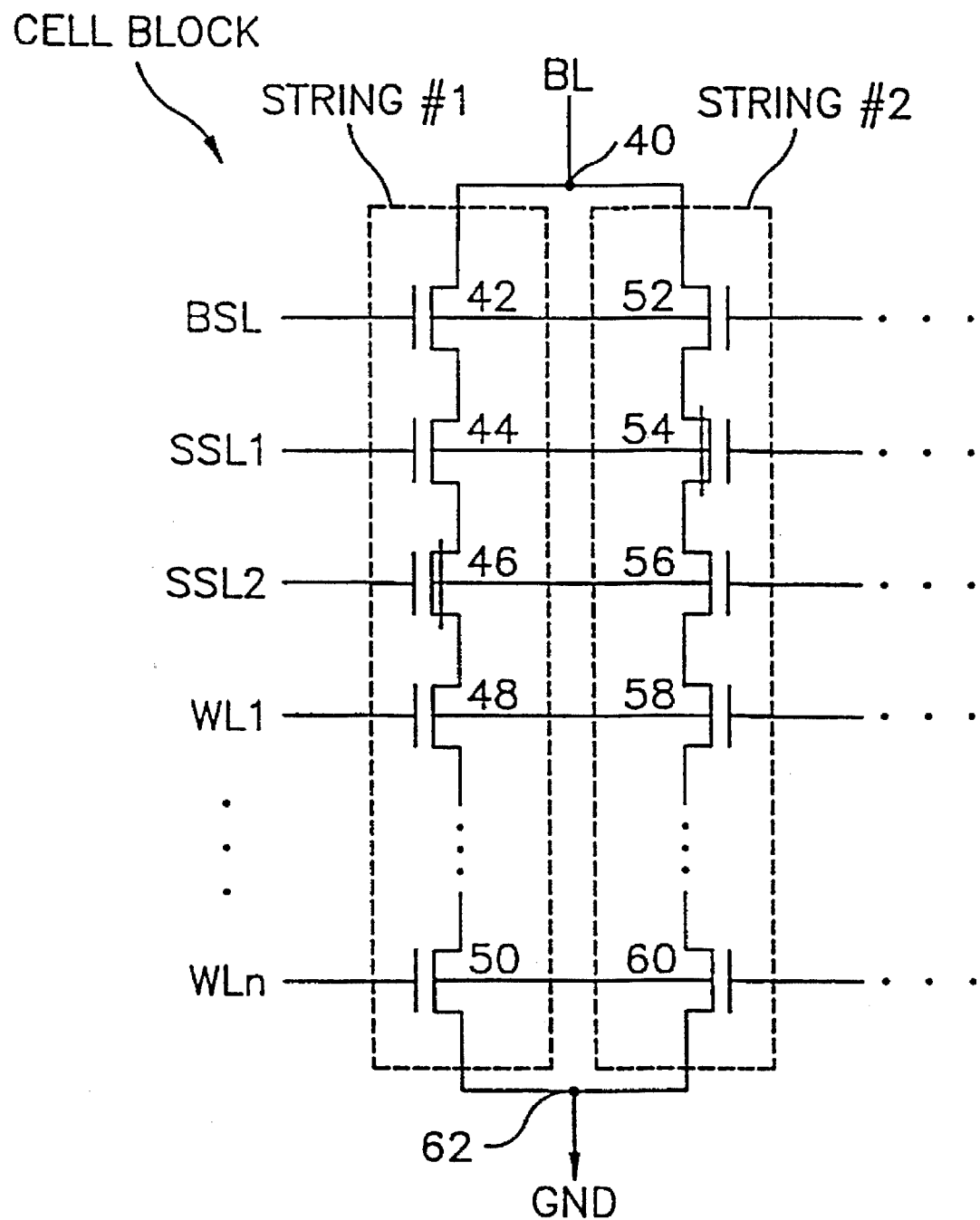
FIG. 3 is a circuit diagram illustrating one embodiment of a unit cell structure for suppressing bit line loading according to the present invention.

Referring now to FIG. 3, two memory strings #1 and #2 are connected to one bit line BL. The number of memory strings connected to one bit line may be changed based on the degree of integration, the signal transmission speed, etc. There are a plurality of unit memory cells formed in a matrix having dimensions proportional to the degree of integration of the chip. A memory string consists of a block select transistor 42 (or 52) connected by its drain to a bit line and controlled by signals on a block select line BSL, string select transistors 44 and 46 (or 54 and 56) connected by their channels to the source of the block select transistor 42 (or 52) and controlled by signals on string select lines SSL1 and SSL2, and memory transistors 48, . . . ,50 (or 58 . . . 60) serially connected by their channels between the source of the string select transistor 46 (or 56) and a power source line 62 to which a power source voltage GND is applied. The memory transistors 48, . . . ,50 (or 58...60) have control terminals connected to corresponding word lines WL1, . . . , WLn. The block select transistor 42 or 52 is ideally an enhancement mode transistor. The string select transistors 44 and 46 (or 54 and 56) ideally consist of one enhancement mode transistor and one depletion mode transistor. The number of memory transistors is determined by $2^n$ (n=1,2,3, . . . ).

Figure 4:
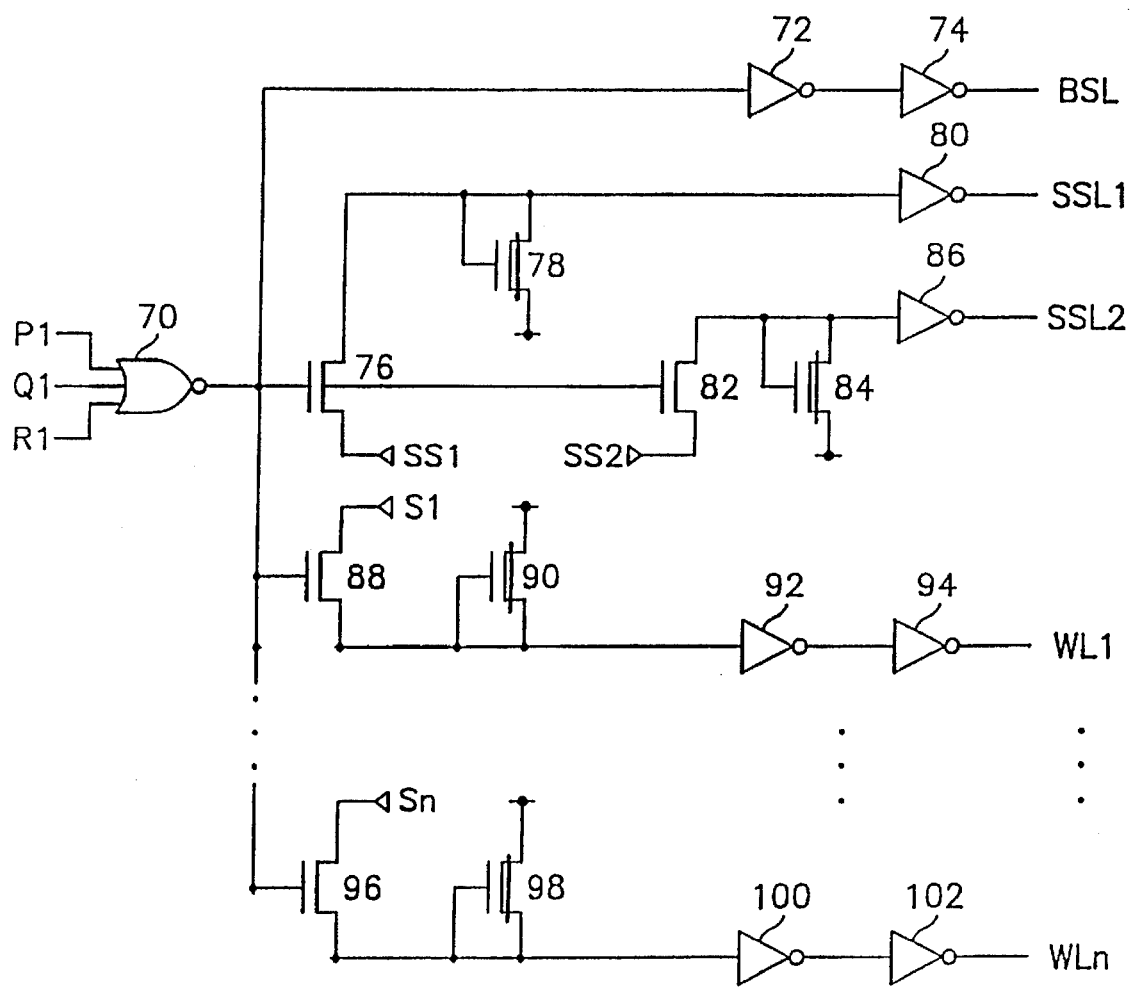
FIG. 4 is a circuit diagram of a row decoder for supplying the string select signal, block select signal and word line signal shown in FIG. 3.

FIG. 4 illustrates one example of a row decoder for supplying the signals on string select lines SSL1, SSL2, block select line BSL and word lines WL1–WLn shown in FIG. 3. The circuit of FIG. 4 is disclosed in Korea Patent Application No. 1991-6569, published on Apr. 24, 1993, assigned to the same assignee as the present invention which corresponds to U.S. patent application Ser. No. 07/964,620. The decoder shown in FIG. 4 exists at each row of a cell array, and memory strings in the same row are enabled by the same row decoder. Signals on lines P1, Q1 and R1 are decoding signals of a row address which are shaped as internal signals. Signals on input lines SS1, SS2, S1, . . . , Sn are generated by a predecoder (not shown). The circuit construction and addressing of the predecoder is disclosed in Korea Patent Application No. 1992-20209, published on Oct. 30, 1992 by the same applicant. The output signals of the predecoder are applied to the row decoder of FIG. 4 and the decoding signals on lines P1, Q1 and R1 generated by the combination of an external address are applied to a NOR gate 70 to select signals on the block select line BSL, string select lines SSL1 and SSL2, and word lines WL1, . . . , WLn. During a select operation, the string select signals and the word line signals are set to, thereby selecting a given memory cell. The NOR gate 70 generates logic "low" except for the case where input signals P1, Q1 and R1 are all logic "low". Thus the signals on block select line BSL corresponds to the output of the NOR gate 70. That is, the signal on block select line BSL is always set to logic "low" except for the case where a memory cell within any string of the respective row is selected, thereby rendering nonconductive the block select transistors of unselected rows.

Referring again to FIGS. 3 and 4, the row decoder operates according to the state of an external address signal to select the signal on the block select line BSL. The signal on block select line BSL corresponding to a selected block is set to logic "high" (substantially ground voltage VCC) and the signals on block select lines BSL corresponding to unselected blocks are set to logic "low" (substantially ground voltage VSS). During a memory transistor select operation, voltages applied to the block select line, string select lines and word lines are summarized in the following Table 1. Table 1 shows when the memory transistor 48 of a first string or memory transistor 58 of a second string is selected and when each memory string is not selection. The select processes of other memory transistors are implemented in a like manner.

TABLE 1

|  | when a first string is selected | when a second string is selected | when strings are not selected |
| --- | --- | --- | --- |
| bit line BL | read voltage | read voltage | read voltage |
| block select signal BSL | VCC | VCC | 0 |
| string select signal SSL1 | VCC | 0 | 0 |
| string select signal SSL2 | 0 | VCC | 0 |
| word line WL1 | VCC | VCC | VCC |
| word lines WL2,...,WLn | VCC | VCC | VCC |

In order to explain bit line loading, it is assumed that the chip is 16 Mbits and the architecture of the cell array is 2K×8K. Since block select transistor 42 and 52 are each disposed between a string select depletion mode transistor and a bit line, junction capacitance between the depletion mode transistor and bit line contact portion 40 does not occur. That is, since the ground voltage of 0V is applied to the gate of the block select (enhancement mode) transistor, each active region of memory off from the bit line contact portion 40. In addition, the block select transistor 42 and 52 disposed between the bit line contact portion 40 and the depletion mode transistor are nonconductive, so that gate capacitance of the depletion mode transistors prevented. Hence, the bit line loading is considerably reduced in comparison with the conventional memory cell. Assuming that a cell size W/L=1.0/1.0 [μm], the thickness of a gate oxide film is 160Å, the interval between metal layers forming the bit lines is 1.0 μm, the interval between active regions is 1.0 μm, and the number of memory strings connected to one bit line is 1K, the capacitances are indicated in the following Table 2.

TABLE 2

|  | Conventional Cell Structure | Inventive Cell Structure |
| --- | --- | --- |
| metal line capacitance | a | a |
| junction capacitance | b + 2.56 | b |
| gate capacitance | 2.21 | 0 |
| total | a + b + 4.77 | a + b | units are pf (pico farad:pico = $10^{-12}$)

As indicated in Table 2, in a 16 Mbits nonvolatile semiconductor memory having a cell array structure of 2K×8K, the bit line loading is reduced by 4.77 pf. If such a cell structure is applied to a very large scale semiconductor memory of 64 Mbits, 256 Mbits or more, the effect greatly increases. Hence, a cell structure having a high speed data access operation and excellent adaptive capability for a low power supply voltage can be achieved.

Figure 5A:
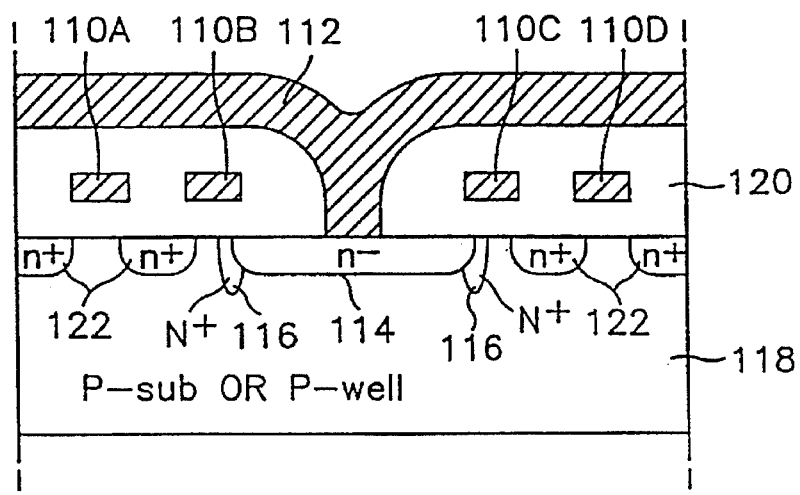
FIG. 5A is a cross sectional view illustrating another embodiment of a unit cell structure for suppressing bit line loading according to the present invention.
Figure 6A:
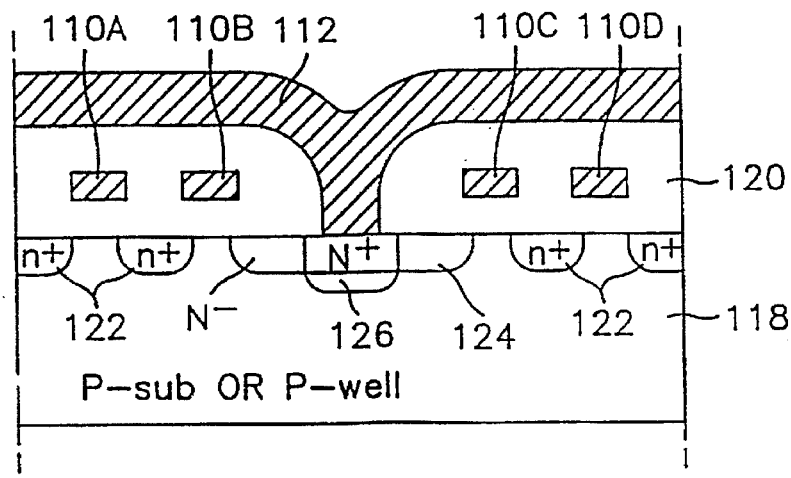
FIG. 6A is a cross sectional view illustrating a further embodiment of a unit cell structure for suppressing bit line loading according to the present invention.

FIGS. 5A and 6A respectively show a unit cell structure for suppressing bit line loading. Embodiments shown in FIGS. 5A and 6A reduce bit line loading by suppressing the junction capacitance generated from the bit line contact portion on a substrate. If this structure is applied to the circuit of FIG. 1, the junction capacitance can be considerably reduced. If this structure is applied to the circuit of FIG. 3 according to the present invention, junction capacitance is suppressed in addition to capacitance suppression provided by the block select transistor. Consequently, bit line loading is greatly suppressed.

Figure 5B:
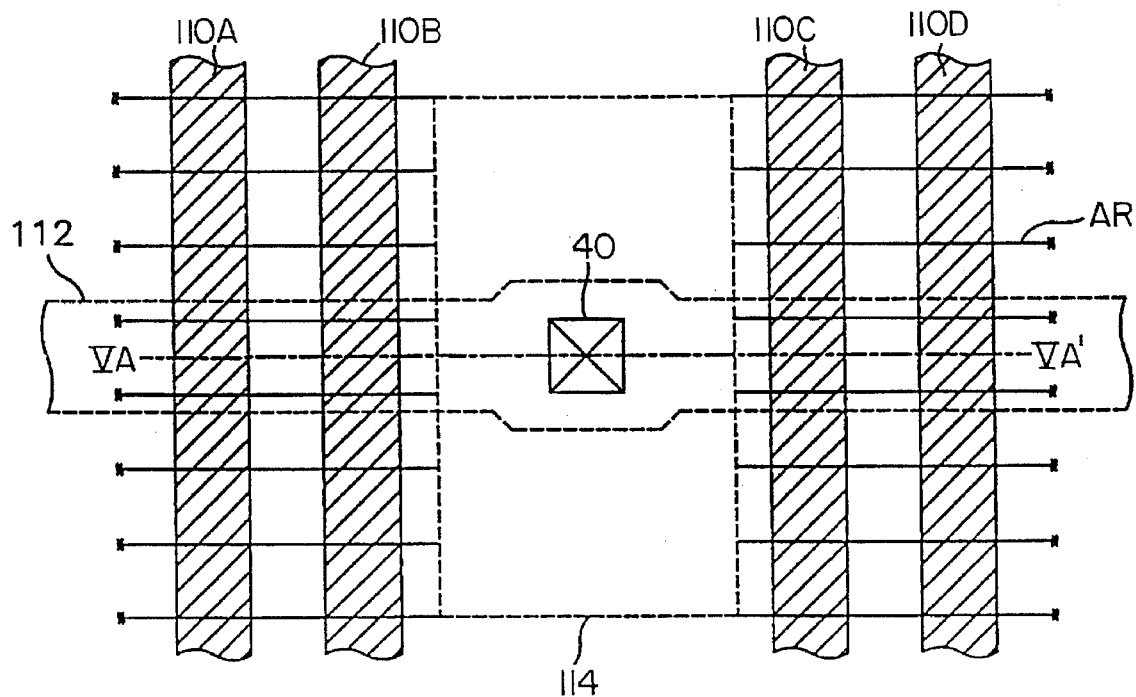
FIG. 5B is a plan view of FIG. 5A.

Referring to FIG. 5A, a bit line contact portion on a substrate is of an $N^-$ layer. FIG. 5B is a plan view of FIG. 5A. In FIG. 5A, an active region 114 of the bit line contact portion in a substrate 118 is made of an $N^-$ layer. Second active regions 122 of an $N^+$ layer are formed in substrate 118, and insulative layer 120 is formed over the substrate 11B. Polysilicon layers 110A–D are disposed within the insulative layer 120. Each of polysilicon layers 110A–D is used as a gate electrode of a memory transistor, and second active regions 122 are used as source and drain regions. Third active region 116 is an $N^+$ region formed around the sides of active region 114 and extends below active region 114. Typically, an $N^+$ layer has a dose of $10^{15}$ to $10^{17}$ ions/cm$^3$, while an $N^-$ layer has a dose of $10^{10}$ to $10^{15}$ ions/cm$^3$. Capacitance in the $N^-$ layer is remarkably small relative to the $N^+$ layer due to the difference in impurity concentration. Thus, the junction capacitance created between the $N^-$ layer 114 of the active region and bit line 112 is considerably suppressed. To achieve the configuration of FIG. 5A, as is well known in the art, impurities are implanted on the $N^-$ active region only by use of a mask and then the $N^-$ active region is masked to form the $N^+$ active region. The $N^-$ active region may alternatively be formed through an opposite process. Preferably, the impurity concentration of the $N^-$ layer 114 is about $10^{12}$ ions/cm$^3$. It is natural that impurities larger than those of the $N^-$ active region 114 should be implanted to an $N^+$ active region 122 used as the active region of a memory transistor adjacent to the bit line contact portion.

Figure 2:
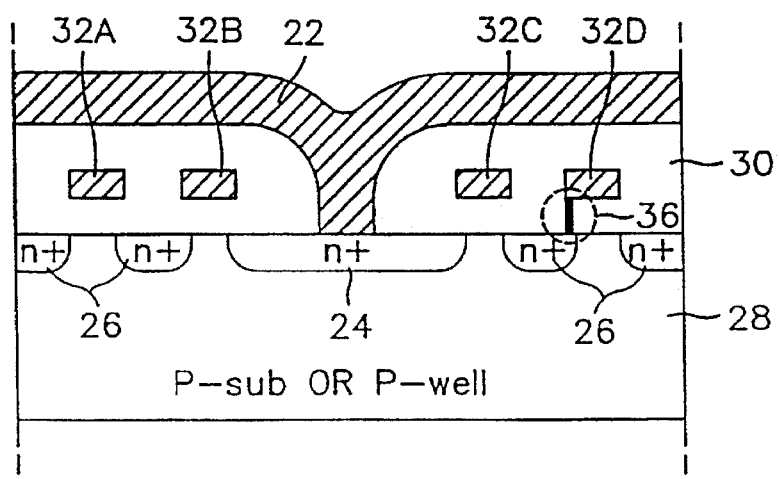
FIG. 2 is a cross sectional view of a bit line contact portion of FIG. 1.
Figure 6B:
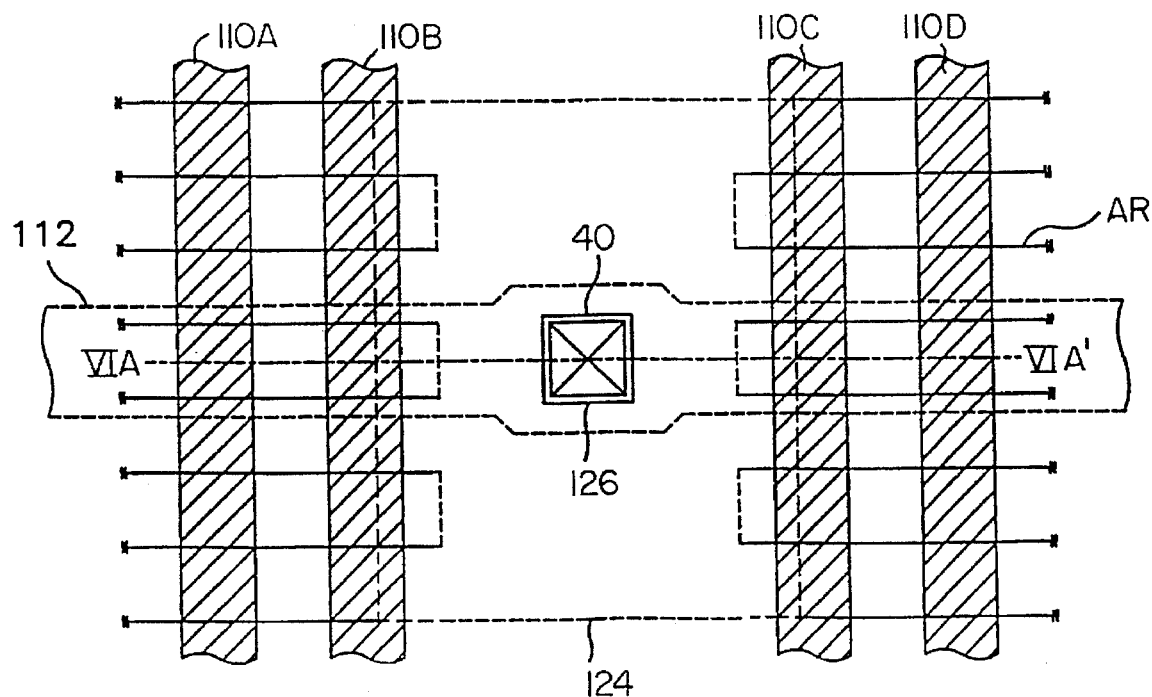
FIG. 6B is a plan view of FIG. 6A.

Referring to FIG. 6A, the bit line contact portion on the substrate is of an $N^-$ layer and an $N^+$ layer. FIG. 6B is a plan view of FIG. 6A. In FIG. 6A, the active region connected with the bit line 112 is made of an $N^+$ active region 126 and an $N^-$ active region 124 is an $N^-$ region formed in substrate 118 which surrounds the $N^+$ active region 126 and does not extend as far into the substrate as the active region 126. Second active regions 122 of an $N^+$ layer are formed in substrate 118, and insulative layer 120 is formed over the substrate. Polysilicon layers 110A–D are disposed within the insulative layer 120. Each of polysilicon layers 110A–D is used as a gate electrode of a memory transistor, and second active regions 122 are used as source and drain regions. In FIG. 2, the active region AR of the bit line contact portion is extended to the bottom portion of adjacent gates, while in FIG. 6A, the $N^+$ active region 126 is formed only at a bit line contact hole and the $N^-$ active region 124 is formed up to the bottom portion of the adjacent gates. FIG. 6B shows the $N^+$ active region 126 formed at the bit line contact hole 40 and the $N^-$ active region 124 formed to adjacent polysilicon layers 110B and 110C. It is preferable that the layer thickness of the $N^-$ active region 124 is 0.1 μm, and the layer thickness of the $N^+$ active region 126 is twice or three times that of the $N^-$ active region 124.

Figure 1:
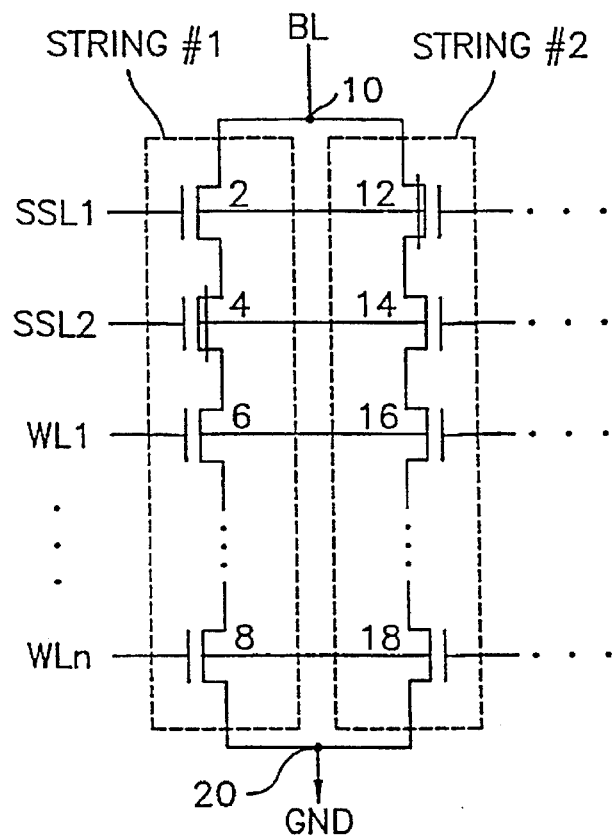
FIG. 1 is a circuit diagram illustrating a unit cell structure of a nonvolatile semiconductor memory according to the prior art.

Junction capacitance is reduced by the configurations shown in FIGS. 5A and 6A as follows. In a memory cell design-rule, it is assumed that the width and space of the active region are 1.0 μm, that the width of the bit line contact hole is 1×1 μm, and that the overlap thickness between the active region on the substrate and the bit line contact portion is 1 μm. If the architecture of the cell array is 2K×8K and the sectional area in which the capacitance for one bit line contact portion is formed is 3×3 μm, the junction capacitance of FIGS. 1 and 2 is 3.22 pf and that of FIG. 5A is 1.61 pf. The junction capacitance of FIG. 6A is 1.76 pf. Therefore, junction capacitance in the structure according to the present invention may be reduced by about one half that in the conventional structure. This result is obtained when a p-type substrate is used and may differ according to the conductivity type of the substrate.

Even when the construction shown in FIGS. 5A and 6A is applied to the conventional cell structure, the same effect is obtained, and if it is applied to the cell structure shown in FIG. 3, the bit line loading problem is greatly suppressed.

The block select transistor 42, 52 of FIG. 3 should be embodied by switching means capable of a completely nonconductive operating state. The row decoder shown in FIG. 4 may be replaced with other row decoders. The sectional area of the $N^+$ active region 116 of FIG. 5A may be determined based on the integrated degree of the chip integration.

As described above, capacitance between the memory string and bit line is suppressed and gate capacitance caused by a depletion mode transistor as string select means is not generated by having the block select transistor connected to the bit line contacting portion of the memory string and by providing the cell structure forming the N⁻ active region at the bit line contact portion. Therefore, a nonvolatile semiconductor memory which minimizes bit line loading is achieved. In particular, the cell structure has good adaptive capability at a low power supply voltage and allows for high speed data access, and improvement of the degree of integration of the nonvolatile semiconductor memory. The present invention also provides for a more reliable nonvolatile semiconductor memory.

In the foregoing description, specific details such as the use of a block select transistor as switching means, the size of the bit line contact portion and memory cell, the thickness of the gate film of the memory cell, the thickness of the active region of the bit line contact portion, etc. have been set forth to provide a more thorough understanding of the present invention. It will be apparent, however, to one skilled in the art, that modifications may be made without departing from the spirit and scope of the invention, as defined by the appended claims and their equivalents.

What is claimed is:

1. A structure of a nonvolatile semiconductor memory device which includes a plurality of transistors comprising:

a substrate having a first conductivity used by said transistors to form a current path;

a first active region portion formed on said substrate and used as a source and a drain of said transistors, said first active region portion having a second conductivity;

an insulative material formed on said substrate;

a bit line formed above said insulative material and connected to said first active region portion; and a second active region portion which surrounds said first active region portion, said second active region portion having said second conductivity and having a higher impurity concentration than said first active region portion, said first active region portion being an N⁻ active region, and said second active region portion being an N⁺ active region, and said second active region portion extending deeper into said substrate than said first active region portion.

2. The device structure according to claim 1 wherein said second active region portion extends deeper into said substrate than said first active region portion without substantially protruding beneath said first active region portion.

* * * * *